(12) United States Patent
Liang

(10) Patent No.: US 9,768,101 B2
(45) Date of Patent: Sep. 19, 2017

(54) HIGH DENSITY INTEGRATED CIRCUIT PACKAGE STRUCTURE AND INTEGRATED CIRCUIT

(71) Applicant: Dazhong Liang, Shenzhen (CN)

(72) Inventor: Dazhong Liang, Shenzhen (CN)

(73) Assignee: China Chippacking Technology Co. Ltd., Shenzhen (CN)

( * ) Notice: Subject to any disclaimer, the term of this patent is extended or adjusted under 35 U.S.C. 154(b) by 0 days.

(21) Appl. No.: 15/260,069

(22) Filed: Sep. 8, 2016

(65) Prior Publication Data

US 2017/0207149 A1  Jul. 20, 2017

(30) Foreign Application Priority Data

Jan. 15, 2016  (CN) .......................... 2016 1 0027678

(51) Int. Cl.
| | | |
|---|---|---|
| *H01L 21/00* | (2006.01) | |
| *H01L 23/495* | (2006.01) | |
| *H01L 21/48* | (2006.01) | |
| *H01L 21/56* | (2006.01) | |
| *H01L 23/29* | (2006.01) | |

(52) U.S. Cl.
CPC .... *H01L 23/49541* (2013.01); *H01L 21/4853* (2013.01); *H01L 21/56* (2013.01); *H01L 23/293* (2013.01); *H01L 23/4951* (2013.01); *H01L 23/4952* (2013.01); *H01L 23/49586* (2013.01)

(58) Field of Classification Search
CPC ............. H01L 224/48247; H01L 24/29; H01L 294/14; H01L 23/49555

USPC .......................... 257/666, 784; 438/111, 123
See application file for complete search history.

(56) References Cited

U.S. PATENT DOCUMENTS

| | | | | |
|---|---|---|---|---|
| 2007/0170560 | A1* | 7/2007 | Gaucher | H01L 23/66 257/676 |
| 2013/0093088 | A1* | 4/2013 | Chau | H01L 23/49517 257/738 |
| 2013/0105929 | A1* | 5/2013 | Ganbe | C08G 59/32 257/433 |

* cited by examiner

*Primary Examiner* — S. V. Clark

(57) ABSTRACT

The present invention relates to the technical field of integrated circuit package, and more specifically, this invention relates to a high density integrated circuit package structure and an integrated circuit with this package structure. A high density integrated circuit package structure according to this invention comprises a sealed metal lead frame, a chip, and a cuboid plastic package structure with micron connecting wires. The length ($A_1$) of the plastic package structure meets the relationship $1.20 \text{ mm} + (B-8) \times 0.3 \text{ mm}/2 \leq A_1 \leq 4.50 \text{ mm} + (B-8) \times 1.00 \text{ mm}/2$, the width ($A_2$) of the plastic package structure meets the relationship $1.20 \text{ mm} \leq A_2 \leq 3.50 \text{ mm}$, the thickness ($A_3$) of the plastic package structure meets the relationship $A_3 \geq 0.35 \text{ mm}$, and B is the number of the outer leads and is an integer number meeting the relationship $4 \leq B \leq 68$. A package structure according to this invention may meet the demands generated when chip manufacturing technology progresses from micron scale to sub-micron scale, or even nanometer scale. It may satisfy the requirements of low power consumption, high speed, large capacity and small volume for portable products.

16 Claims, 1 Drawing Sheet

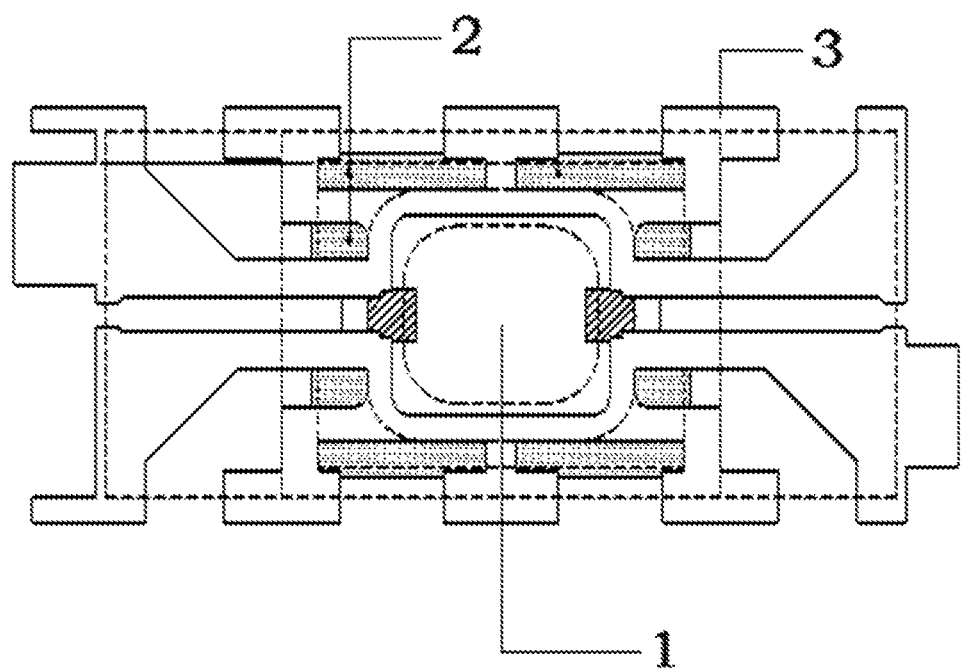

HIGH DENSITY INTEGRATED CIRCUIT PACKAGE STRUCTURE AND INTEGRATED CIRCUIT

BACKGROUND OF THE INVENTION

1. Field of the Invention

This invention relates to the technical field of integrated circuit package, and more specifically, this invention relates to a high density integrated circuit package structure and an integrated circuit with this package structure.

2. Description of Related Art

The integrated circuit is the core of modern technology and the foundation for developments in modern scientific technology. The instruments based on integrated circuits are indispensable to all scientific research. The integrated circuit is also the foundation for modern civilizations and radically changed the way of modern life. It provides intelligent functions in many fields, such as Web of Things, Internet, computer, television, refrigerator, mobile phone, iPad, iPhone, automatic control and the like.

The manufacturing of integrated circuits comprises design, wafer manufacturing, package and testing. While package is a key process among them. Various package forms built upon package technologies are invented to meet the special requirements of various purposes, such as performance, volume, reliability, shape and cost down.

Integrated circuit package comprises: (1) separating an integrated circuit wafer into single chip by polishing and cutting, which guarantee single crystal material with perfect lattice structure; (2) fixing the chip on the lead frame with conductive adhesive or eutectic; (3) connecting the chip to outer leads with micro connecting wires (micron scale); (4) protecting the chip and the wires with polymer or ceramics and forming them into a product with certain shape.

Integrated circuit package can be classified into sealed ceramic package and plastic package. Sealed ceramic package is a technology to assemble package chips and the bounding material surrounding them with vacuum sealing device. Sealed ceramic package is typically applied in high performance levels. Plastic package, on the other hand, assemble the chips with epoxy resin. Chips are not completely separated from their surroundings, and therefore the surrounding air may penetrate the package and impair the quality. However, the plastic package technology has significant development in the application and performance in recent years, which enables auto manufacturing and meets most of the requirements in civil and industry field with low cost.

Existing package forms of integrated circuits include DIP, SOP, SSOP, TSSOP, MSOP, QFP, PLCO, QFN and DFN. The package structures of SOP, SSOP, TSSOP and MSOP are used for most of civil and industry products due to their small volume, better frequency response, lower inner resistance, less material cost, and high auto manufacturing level. They are also easy to auto operate and provide high production efficiency at low cost.

Package forms of integrated circuits have great impacts on the performance, reliability and cost down. As chip manufacturing technology develops from micron scale to nanometer scale, the Moore's law that the performance per unit area of chips is doubled every 18 months gradually become invalid. In the future, high performance cloud computing, Web of Things and mobile network must rely on the breakthrough of the core technologies of IC manufacturing. It will be more and more difficult to provide the IC with higher speed, larger capacity and low power consumption. Therefore, we need more breakthroughs in package forms and package technologies. The present chip manufacturing technologies of IC are of micron scale or even wider scale, and therefore the chip size is generally larger. In order to accommodate chips with larger size, the package structures become much and much larger and consume more and more raw material. A larger area is needed when the integrated circuit is welded onto a PCB, which costs more. In order to meet various sizes of products, various structures are designed like the SOP, SSOP, TSSOP and MSOP. When the smaller chips are packaged in existing package structures, the performance of frequency response, inner resistance, power consumption, thermal consumption and the life time become worse due to their longer pin wires. As chip manufacturing technology develops from micron scale to sub-micron scale, or even nanometer scale (16 nm is ready to be mass-produced), chip sizes are decreased with geometric series. With the meantime, there is also need to reduce power consumption and improve frequency response and package structures.

SUMMARY OF THE INVENTION

The purpose of this invention is to provide a high density IC package structure and an IC in order to catch up with the development in chip manufacturing technology from a micron scale to a sub-micron scale, or even a nanometer scale. And to solve the problems of package structures produced by existing technologies, such as large volume of circuits and bad electrical and thermal performance characteristics, which affect product reliability, reduce frequency response and increase manufacturing cost.

To achieve the foregoing purpose, this invention adopts the technologies as following:

Provides a high density IC package structure, which comprise: a metal lead frame, include a die pad, inner leads and outer leads; a chip fixed on the die pad; micron connecting wires between the chip and the inner leads; a cuboid plastic package structure for sealing the metal lead frame, the chip and the micron connecting wires; wherein the length (A1) of the plastic package structure satisfies the relationship: $1.20\text{ mm}+(B-8)\times 0.3\text{ mm}/2 \leq A1 \leq 4.50\text{ mm}+(B-8)\times 1.00\text{ mm}/2$, the width (A2) of the plastic package structure satisfies the relationship: $1.20\text{ mm} \leq A2 \leq 3.50\text{ mm}$, the thickness (A3) of the plastic package structure satisfies the relationship: $A3 \geq 0.35\text{ mm}$, and B is the number of the outer leads and is an integer number satisfying the relationship: $4 \leq B \leq 68$.

Preferably, the span (B1) of the outer leads satisfies the relationship: $2.30\text{ mm} \leq B1 \leq 5.20\text{ mm}$, and the pitch (B2) between the outer leads satisfies the relationship: $0.30\text{ mm} \leq B2 \leq 1.00\text{ mm}$.

Preferably, the length (A1) of the plastic package structure satisfies the relationship: $A1=2.50+(B-8)\times 0.53/2\text{ mm}$, the width (A2) of the plastic package structure is 2.60 mm, the thickness (A3) of the plastic package structure is 0.85 mm, the span (B1) of the outer lead is 4.00 mm, the width of the outer leads ranges from 0.20 mm to 0.23 mm, and the pitch (B2) between the centers of outer leads is 0.53 mm. As an exemplary embodiment, the number of the outer leads may be 6, 8, 10, 12, 14, 16, 18, 20 or 24, and the length (A1) of the plastic package structure is 2.05 mm, 2.60 mm, 3.00 mm, 3.60 mm, 4.05 mm, 4.60 mm, 5.10 mm, 5.60 mm and 6.60 mm, respectively.

Preferably, in the package structure, a stress releasing groove is provided at the bottom of the cuboid plastic package structure. Both the depth and the width of the stress releasing groove are 0.05 mm, and the stress releasing groove is a spiral groove.

The integrated circuit package structure comprises plastic package resin, a metal lead frame, and a silicon chip. Because these materials vary greatly in their properties and have different coefficients of thermal expansion, stress is generated when they are combined together. The generated stress may not only cause delamination among the different materials and affect product reliability, but also cause the chip to bend and lead to silicon lattice distortion. A great number of simulation experiments demonstrate that when providing a foregoing spiral groove and a conventional-shaped stress releasing groove (for example, a conventional reticulated stress releasing groove) to a package structure as in this invention may prevent temperature changes and superposition of stress vectors of external force when the integrated circuit is used. It can effectively prevent silicon lattice distortion and greatly prevent the impact of stress on the performance of the integrated circuit.

Preferably, to improve the thermal conductivity of integrated circuits, this invention further optimized the inner position relation of the package structure. The distance between the die pad and the top end of the inner lead is 0.150 mm, the sink distance of the die pad is 0.152 mm, and the length of the inner lead is 0.400 mm. With the above design and an appropriate layout, this invention improves the performance of capacitance, inductance and resistance. This also reduces the inner temperature of the integrated circuit and further improves the life time and reliability.

The second aspect of this invention relates to an assembly method of the foregoing high density integrated circuit package structure.

The package method comprises the following steps: (1) providing a metal lead frame, comprising a die pad, inner leads and outer leads; (2) providing a chip, and bonding the chip to the die pad of the lead frame; (3) electrical connecting the chip and the inner leads with micron connecting wires; (4) forming a cuboid plastic package structure to seal the metal lead frame and the chip by molding.

The third aspect of this invention relates to an integrated circuit, which is formed by adopting multiple of the foregoing high density integrated circuit package structures base on this invention.

Compared with the integrated circuit package structures produced by existing technologies, this invention has the following advantages:

(1) The inner resistance is greatly reduced, which improves the electrical and thermal performance, reduces the consumption of metal resources and manufacturing cost by nearly a half.

(2) Reduce the transportation distance of electrical signals, improve the delay time and parasitic parameter, which greatly improve the frequency response.

(3) Improve the package efficiency, cost down about 45% of the total package material consumption. The improved structure greatly enhances production efficiency, and the total production efficiency may be increased by about 35%. The highest production efficiency is twice the original such as the trim & form and molding process. The integrated circuit occupies a smaller space on the PCB, which reduces the net area by 75%.

(4) A variety of package structures may be accommodated, such as SOP, TSSOP, SSOP, MSOP and some QFN/DFN, satisfying increasing requirements of portable products.

BRIEF DESCRIPTION OF THE DRAWINGS

FIG. 1 is a schematic structural diagram of a lead frame die pad according to one embodiment of this invention.

DETAILED DESCRIPTION OF THE PREFERRED EMBODIMENTS

The further expand on the description of the high density integrated circuit package structure and the IC mentioned in this invention with the embodiment as following will help the technicians in this field to understand the conception and technologies of this invention more completely, accurately and deeply.

Embodiment 1

As shown in FIG. 1, the high density integrated circuit package structure of the embodiment comprises a lead frame die pad 1, inner leads 2 and outer leads 3; a chip fixed on the die pad; micron connecting wires between the chip and the inner leads; and a cuboid plastic package structure sealing the metal lead frame, the chip and the micron connecting wires; the inner leads and the outer leads are connected with each other. In implementation, the inner leads may also be connected to the outer leads by a layer of silver alloy plating. The length (A1) of the plastic package structure satisfies the relationship: $1.20 \text{ mm}+(B-8)\times 0.3 \text{ mm}/2 \leq A1 \leq 4.50 \text{ mm}+(B-8)\times 1.00 \text{ mm}/2$; the width (A2) of the plastic package structure satisfies the relationship: $1.20 \text{ mm} \leq A2 \leq 3.50 \text{ mm}$; the thickness (A3) of the plastic package structure satisfies the relationship: $A3 \geq 0.35 \text{ mm}$; B is the number of the outer leads and is an integer number satisfying the relationship: $4 \leq B \leq 68$. In the following, a package structure having 8 outer leads will serve as an example to further describe the high density integrated circuit package structure according to the present invention. The package structure of the present invention is called CPC series package structure, i.e. CPC4, CPC6, CPC8, etc. In the following description, the package structure having 8 outer leads that is representative of this invention is called as CPC8.

In this embodiment, the plastic package structure is packaged with epoxy resin composition. Preferably, the epoxy resin composition comprises bisphenol F type epoxy resin (DGEBF), styrene-maleic anhydride alternating copolymer (SMA1000), polyglycol diglycidylether, polypropylene glycol polytetrahydrofuran polytetrahydrofuran terminal hydroxyl, polybutenyl succinimide, silica white, silane coupling agent composition and releasing agent.

Preferably, the epoxy resin composition comprises 25-27.5 wt % of styrene-maleic anhydride alternating copolymer (SMA1000), 28-30 wt % of fused silica, 10-12 wt % of polypropylene glycol polytetrahydrofuran polytetrahydrofuran terminal hydroxyl, 5.5-6.0 wt % of silica white, 3.5-4.0 wt % of polyglycol diglycidylether, 1.5-2.0 wt % of polybutenyl succinimide, 0.5-0.8 wt % of silane coupling agent composition, releasing agent and the allowance thereof bisphenol F type epoxy resin (DGEBF). In this embodiment, the epoxide equivalent of the bisphenol F type epoxy resin is 171-175, and the viscosity thereof at 25° C. is 4000-6000 mPa·s. The specific surface of the silica white is 100-300 $m^2/g$, and the particle size of the silica white is 10-50 nm. The preferred particle size of the fused silica is 1-50 μm. The silane coupling agent composition is preferably at least one of γ-glycidoxypropyl trimethoxysilane, γ-methacryloxypropyl trimethoxy silane or γ-methyl methacryloxypropyl triethoxysilane.

The releasing agent may be organic series releasing agent or metallic stearate. The ability of anti-reflowing and moisture resistance is improved by adding polypropylene glycol polytetrahydrofuran polytetrahydrofuran terminal hydroxyl and polybutenyl succinimide in this embodiment. Further, because package structure modulus is reduced after solidifying, stress generated by interface deformation may be effectively absorbed. Therefore, basically no chip separation or internal cracking are observed, and the package performance is good.

In this embodiment, the micron connecting wire is an alloy wire with a diameter of 10-25 μm. The copper (Cu) alloy contains 2.50-3.05 wt % of silver (Ag), 0.08-0.10 wt % of Indium (In), 0.05-0.06 wt % of Germanium (Ge), 0.01-0.02 wt % of niobium (Nb), 0.003-0.005 wt % of zirconium (Zr) and the allowance thereof Cu. The micron connecting wires may be obtained by conventional ingot casting, continuous casting, rough stretching, annealing, accurate drawing and annealing processing technic preparation. In addition, a surface of the copper alloy wire is plated with a layer of silver protection. The micron connecting wire has good anti-oxidization performance, which helps reduce a welding pitch. It is especially suited to the high density integrated circuit package with multiple pins according to the present invention. The micron connecting wires and the chip, and the micron connecting wires and the inner leads are electrical connected by soldering.

Pb-free solder is used for soldering. The Pb-free solder contains 3.2-3.6 wt % of In, 1.3-1.5 wt % of Ag, 0.5-0.6 wt % of Bi, 0.25-0.30 wt % of Cu, 0.10-0.15 wt % of Ge, and the allowance thereof tin (Sn). The melting temperature of the solder is 201-206° C., with good solderability and reliability and shear strength greater than 35.5 MPa. The electrical conductivity is 10.2-10.5% IACS, which is suited to the high density integrated circuit package with multiple pins according to the present invention. Additionally, pure copper wire is used for the micron connecting wires. The micron connecting wires and the chip, and the micron connecting wires and the inner lead wires may be connected by atom attraction even in high temperature. Furthermore, the pin wires and the PCB can be electrical connected by soldering. Pb-free solder is used for soldering. The Pb-free solder contains 3.2-3.6 wt % of In, 1.3-1.5 wt % of Ag, 0.5-0.6 wt % of Bi, 0.25-0.30 wt % of Cu, 0.10-0.15 wt % of Ge, and the allowance there of tin (Sn).

Confirming the Width of the Plastic Package:

Through the research of how to reduce the inner resistance of a package, this invention finds out that when the distance between the lead frame die pad and the inner lead is smaller than 0.15 mm, the electric property is significantly improved, and so is the combined efficiency, yield and the cost benefit. According to the reliability research, this invention finds out that when the width of the plastic package is about 2.60 mm, the reliability, electric property and comprehensive performance is the best. Existing manufacturing technology of chip production requires the scale smaller than 0.6 micron. The resulting chip size is generally between 0.5×0.5 mm$^2$ and 1.5×1.8 mm$^2$, which requires that the size of the lead frame die pad be ≤1.5×1.8 mm$^2$. The distance between the edge of the die pad and the top end of the inner lead is determined by the thickness of the material, the material of the cutter and the processing precision, which is required to be above 0.10 mm. Considering the efficiency and the life time of the cutter, the most suitable distance is about 0.15 mm. Considering the strength and reliability of the pins, the distance between the top end of the inner lead and the edge of the plastic package should be 0.20-0.40 mm.

Therefore, if only considering the comprehensive performance, the width of the plastic package should be larger than 2.0 mm. If only considering the lead frame manufacturing technology, the minimal die pad is 0.762×0.762 mm$^2$, and the width of the plastic package is only 1.40 mm. This can be suitable for around 40% of products. Compared with the width of 2.60 mm, the consumption of the molding resin should be reduced by 15%, which accounts for 1.0% of the total material cost. Considering the investment and the requirements of standardization application, it is undesirable to develop package structures separately. Similarly, if increasing the width to 3.5 mm, the cost will be increased by about 7.0%, and the production efficiency will be reduced, making no beneficial for the performance and comprehensive performance. Above all, the width of the plastic package should be 2.60 mm. Compared with 2.60 mm, the width between 1.4 mm and 3.5 mm increases the cost without making any substantial differences or any improvement to the quality. The width between 1.4 mm and 3.5 mm should not be adopted, but it also be within the claims of this invention.

Confirming the Length of the Plastic Package:

The length of the plastic package is the shorter the better in order to reduce the space on the PCB, the weight of the integrated circuit, and the package material consumption. The shorter size could also enhance the efficiency of integrated circuit production (Note: When the IC unit is shorter, the production efficiency is higher because of the lead frame can arrange more products) and reduce cost. When manufacturing PCBs, if the wire width is larger than 0.20 mm and the pitch is greater than 0.30 mm, the production cost is the lowest, the efficiency is the highest and the quality is the most stable. So, the pitch between the pin should be larger than 0.50 mm. Considering the electrical performance and the requirements of mechanical processing, the width of the pin should be 0.20 mm-0.23 mm and the wire width of the corresponding PCB should be 0.22 mm-0.23 mm; that is, the best pitch size is 0.53 mm. The pitch between 0.35 mm and 0.53 mm does not improve the performance but increases the combined cost. The pitch between 0.53 mm and 1.00 mm increases the cost but does not improve the performance. Although the other pitches between 0.35 mm and 1.00 mm are applicable and the quality is within the specs, but the cost is increased. It should also be within the claims of this invention. The length of a corresponding plastic package is confirmed as 2.60 mm. Other lengths of the plastic package between 1.20 mm and 4.50 mm should also be within the claims of this invention.

Confirming the Thickness of the Plastic Package:

To satisfy the requirements that the end products are light and thin, the plastic package is the thinner the better. To meet the requirement of reduce the consumption of molding resin, the plastic package should also be the thinner the better. Considering the thickness of the chip is generally greater than 0.19 mm, the safe distance between the chip surface and the plastic package surface should be 0.2 mm (considering the wire loop height), the height from die pad bottom surface to the plastic package bottom surface is greater than 0.2 mm, the thickness of the lead frame is greater than 0.11 mm, therefore, the thickness of the plastic package should be greater than 0.70 mm. Base on considering the cost of wafer back grinding, how easy to control the loop height, the thickness of lead frame concern of resistance and strength, the stress generated when trim & form, the gas tightness and comprehensive performance of the plastic package material, the best thickness is confirmed as 0.85 mm. When the thickness is within 0.35 mm-0.85 mm, the difficulty of manufacturing and the combined cost are increased. When the thickness is greater than 0.85 mm, the cost and the material consumption are significantly increased. All in word, the best thickness is confirmed as 0.85 mm. Although the other thicknesses above 0.35 mm are applicable, compared to the thickness of 0.85 mm, no significant advantages are provided, and the comprehensive performance is substandard. However, it should also be within the claims of this invention.

The Angle and Corner at the Height Direction of the Plastic Package:

Generally no research is done about the angle and corner shape at the height direction of the plastic package. They are confirmed by the enterprise according to the requirements of mold releasing technology and aesthetics.

A stress releasing groove is provided at the bottom of the cuboid plastic package. The depth and the width of the groove are both 0.05 mm. The length of the groove and the width of the cuboid plastic package are equal. The stress releasing groove is a spiral groove. The spiral groove are filled with composition of polybutenyl succinimide and amino polyamide resin, and the composition is solidified at 40-50° C. for 3.0-5.0 minutes, wherein the mass ratio of polybutenyl succinimide and amino polyamide resin is 3:1. The integrated circuit package structure comprises plastic package resin, metal lead frame, and a silicon chip. Because these materials vary greatly in their properties, their coefficients of thermal expansion are different. Therefore, stress is generated when they are combined together. The stress will not only cause delamination that affects product reliability, but also cause the chip to bend. A great number of simulation experiments of silicon lattice distortion demonstrate that the spiral groove and the conventional-shaped stress releasing groove (for example, a conventional reticulated stress releasing groove) to a package structure as in this invention may prevent temperature changes and superposition of stress vectors of external force when the integrated circuit is used. It can also cause the stress to dissipate non-directionally and can effectively prevent silicon lattice distortion, greatly preventing the impact of stress on the performance of the integrated circuit.

Existing SOP, TSSOP, SSOP, MSOP package forms are closest to the CPC8 product according to this embodiment. They may be regarded as the closest existing technology.

When manufacturing other products with different quantity of leads according to this invention, we will consider the electrical performance, thermal performance, power consumption, reliability, production efficiency and quality, and will choose a best specific structure size within the claims of this invention. We will also adjust the lead frame structure based on the requirements of I/O pins, thermal performance, withstand voltage, frequency characteristic, etc. For example, in CPC8-4L or CPC8-5L structure, we may combine 4 pins to 2 pins or 1 pin in order to improve thermal performance on one side of the package, or remove 1 pin or 2 pins to enhance withstand voltage performance on another side, etc. In a word, any modification based on specific requirements within the scope of this invention is within the protected scope of this invention.

Compared with existing SOPS, CPC8 provides the following advantages:

A. Improved Quality

1. The reliability is significantly improved: The stress groove theory, die pad surface structure and short runner structure provided in this invention effectively solve the problems of contour deformation, delamination between different materials, chip deformation, combination of the plastic package with different materials, molecule structure of the plastic package and damage to the micron connection wires generated by fluid during the molding process. Product reliability is increased, and high quality is guaranteed. The stress releasing groove is a spiral structure, an effectively application of the thread form structure property to the mechanism design of stress.

2. The electrical and thermal performance and frequency characteristic are significantly improved, which meets the requirement of the chip with a decreasing wire width. The micron connection wires are shortened, the pins are shortened, the inner resistance and thermal resistance of the package are significantly reduced, improving the electro-thermal performance and frequency characteristic, enhancing the reliability.

B. Significantly Reduce Cost

1. The volume of an SOP8 plastic package is 4.9 mm (length)×3.9 mm (width)×1.5 mm (thickness)=28.7 mm$^3$. In the exemplary embodiment of this invention, wherein the number of outer leads is 8, the size of a CPC8 plastic package is 2.6 mm (length)×2.6 mm (width)×0.85 mm (thickness)=5.746 mm$^3$, saving 80% of plastic package resin. As the yearly production of the entire China is more than 50 billion products, this invention may save 500×0.008×0.80 RMB (the cost price of per resin)=320 million RMB.

2. The plane expansion volume of an SOP8 metal lead frame is 7.8 mm (width)×4.9 mm (length)×0.203 mm (thickness)=7.76 mm$^3$. The plane expansion volume of a CPC8 metal lead frame is 5.00 mm×2.60 mm×0.154 mm=2.00 mm$^3$, saving 74% of metal material. As the yearly production of the entire China is more than 50 billion products, the copper price is 50 RMB/kg, and the copper density is 8.93, this invention may save 500×(7.76−2.13)×8.93/1000/1000×50=126 million RMB.

3. The electroplating area may be saved, therefore reducing the tin consumption, packing and transportation cost. Because the density of the lead frame is greatly increased, the manufacturing net efficiency may be enhanced by more than 35%.

In view of the foregoing, this invention may save a lot of valuable resources and power consumption for manufacturing and using the products, and may enhance efficiency, create profits and reduce cost for end users. It may save more than 500 million RMB of production cost alone. The first series of products provided by this invention are CPC8, CPC12, CPC14, CPC16, CPC20 and CPC24 (the six mostly used products currently). They may save more than 100 million RMB per year. The launch of all series of products according to this invention is prospected to save billions of RMBs.

C. Other Advantages

1. As this invention occupies a smaller space on the PCB because of the volume scale down, the overall unit volume may be reduced. A PCB of a same size may accommodate more electronic elements, so that the overall performance of a unit of a same volume is enhanced.

2. As the weight of the product according to this invention is lighter because of the volume scale down, the weight of a PCB bonded with the integrated circuit is lighter.

In view of the foregoing, package products according to this invention improve the economic advantage, production quality, function, efficiency and advantage of the industry chain.

Compared with TSSOP8, SSOP, MSOP8 and some QFN/DFN, CPC8 has the following advantages:

A. The Quality Advantage

1. The reliability is significantly improved: The stress groove theory, die pad surface structure and short runner structure provided in this invention effectively solve the problems of contour deformation, delamination among different materials, chip deformation, combination of the plastic package with different materials, molecule structure of the plastic package and damage to the micron connection wires generated by fluid during the molding process. Product reliability is increased, and high quality is guaranteed.

2. The electrical and thermal performance and frequency characteristic are significantly improved. The micron connection wires are shortened, the pins are shortened, the inner resistance and thermal resistance of the package are significantly reduced, improving the electrical performance and frequency characteristic and enhancing the reliability.

B. Cost and Other Advantages

1. The material consumption of copper, resin and tin is greatly reduced.

2. The production efficiency is significantly improved.

3. The application range is wider.

4. Compared with QFN and DFN, the manufacturing difficulty is lower, and the manufacturing cost of material is significantly lower.

In view of the foregoing, some package products that may have been manufactured only in the above-mentioned existing package forms may now be packaged according to the present invention, which provides a higher economic advantage.

In current society, labor cost is high, resources are lacking, raw material prices are higher, and low carbon is an inevitable social trend. The present invention satisfies the requirements of our times, saving valuable natural resources and human resources, and meeting the demand of low carbon and green society.

For those ordinary skilled in the art, the embodiment according to the present invention is clearly not limited to the specific implementation in the manner described above. Any use of the method, concept and technology program provided in this invention with various non-substantive improvements, or any application of the method, concept and technology program provided in this invention with or without modifications is within the protected scope of this invention.

What is claimed is:

1. A high density integrated circuit package structure, comprising:
   a metal lead frame, comprising a die pad, inner leads and outer leads; a chip fixed on the lead frame die pad; micron connecting wires between the chip and the inner leads; a cuboid plastic package structure for sealing the metal lead frame, the chip and the micron connecting wires;
   wherein the length (A1) of the plastic package structure satisfies the relationship $1.20 \text{ mm}+(B-8)\times0.3 \text{ mm}/2 \leq A1 \leq 4.50 \text{ mm}+(B-8)\times1.00 \text{ mm}/2$; The Width (A2) of the plastic package structure satisfies the relationship $1.20 \text{ mm} \leq A2 \leq 3.50 \text{ mm}$; the thickness (A3) of the plastic package structure satisfies the relationship: $A3 \geq 0.35 \text{ mm}$; and B is a number of the outer leads and is an integer number satisfying the relationship: $4 \leq B \leq 68$.

2. A high density integrated circuit package structure of claim 1, wherein the span (B1) of an outer lead satisfies the relationship: $2.30 \text{ mm} \leq B1 \leq 5.20 \text{ mm}$, and the pitch (B2) between the outer lead satisfies the relationship: $0.30 \text{ mm} \leq B2 \leq 1.00 \text{ mm}$.

3. A high density integrated circuit package structure of claim 1, wherein the length (A1) of the plastic package structure satisfies the relationship $A1=2.50+(B-8)\times0.53/2$ mm, the width (A2) of the plastic package structure is 2.60 mm, the thickness (A3) of the plastic package structure is 0.85 mm, the span (B1) of an outer lead is 4.00 mm, the width of the outer lead ranges from 0.20 mm to 0.23 mm, and the pitch (B2) between the center of outer leads is 0.53 mm.

4. A high density integrated circuit package structure of claim 1, wherein a stress releasing groove is provided at the bottom of the cuboid plastic package structure, and the stress releasing groove is a spiral groove.

5. A high density integrated circuit package structure of claim 4, wherein both the depth and the width of the stress releasing groove are 0.05 mm.

6. A high density integrated circuit package structure of claim 1, wherein the distance between the lead frame die pad and the top end of the inner lead is 0.150 mm, the sink distance of the die pad is 0.152 mm, and the length of the inner lead is 0.400 mm.

7. A high density integrated circuit package structure of claim 1, wherein the plastic package structure is packaged with epoxy resin composition, and the epoxy resin composition comprises bisphenol F type epoxy resin (DGEBF), styrene-maleic anhydride alternating copolymer (SMA1000), polyglycol diglycidylether, polypropylene glycol polytetrahydrofuran polytetrahydrofuran terminal hydroxyl, polybutenyl succinimide, silica white, silane coupling agent composition and releasing agent.

8. A high density integrated circuit package structure of claim 1, wherein the micron connecting wires and the chip, and the micron connecting wires and the inner leads are electrical connected by soldering; Pb-free solder is used for soldering; and the Pb-free solder contains 3.2-3.6 wt % of In, 1.3-1.5 wt % of Ag, 0.5-0.6 wt % of Bi, 0.25-0.30 wt % of Cu, 0.10-0.15 wt % of Ge, and the allowance thereof tin (Sn).

9. A method of package a high density integrated circuit package structure, comprising the following steps:
   providing a metal lead frame, comprising die pad, inner leads and outer leads;
   providing a chip, and fixing the chip to the die pad;
   connecting the chip and the inner leads with micron connecting wires;
   and forming a cuboid plastic package structure for sealing the metal lead frame and the chip;
   and wherein the length (A1) of the plastic package structure satisfies the relationship: $1.20 \text{ mm} (B-8)\times0.3 \text{ mm}/2 \leq A1 \leq 4.50 \text{ mm}+(B-8)\times1.00 \text{ mm}/2$; the width (A2) of the plastic package structure satisfies the relationship $1.20 \text{ mm} \leq A2 \leq 3.50 \text{ mm}$; the thickness (A3) of the plastic package structure satisfies the relationship $A3 \geq 0.35 \text{ mm}$; and B is the number of the outer leads and is an integer number satisfying the relationship $4 \leq B \leq 68$.

10. A method of package a high density integrated circuit package structure of claim 9, wherein the span (B1) of an outer leads meets the relation $2.30 \text{ mm} \leq B1 \leq 5.20 \text{ mm}$, and the pitch (B2) between the outer leads meets the relation $0.30 \text{ mm} \leq B2 \leq 1.00 \text{ mm}$.

11. A method of package a high density integrated circuit package structure of claim 9, wherein the length (A1) of the plastic package structure meets the relationship $A1=2.50+(B-8)\times0.53/2$ mm, the width (A2) of the plastic package structure is 2.60 mm; the thickness (A3) of the plastic package structure is 0.85 mm, the span (B1) of an outer leads is 4.00 mm, the width of an outer leads ranges from 0.20 mm to 0.23 mm, and the pitch (B2) between the center of outer leads is 0.53 mm.

12. A method of package a high density integrated circuit package structure of claim 9, wherein a stress releasing groove is provided at a bottom of the cuboid plastic package structure, and the stress releasing groove is a spiral groove.

13. A method of package a high density integrated circuit package structure of claim 12, wherein both a depth and a width of the stress releasing groove are 0.05 mm.

14. A method of package a high density integrated circuit package structure of claim 9, wherein the distance between the die pad and a top end of an inner lead is 0.150 mm, the sink distance of the die pad is 0.152 mm, and the length of an inner lead is 0.400 mm.

15. A method of package a high density integrated circuit package structure of claim 9, wherein the plastic package structure is packaged with epoxy resin composition, and the epoxy resin composition comprises bisphenol F type epoxy resin (DGEBF), styrene-maleic anhydride alternating copolymer (SMA1000), polyglycol diglycidylether, polypropylene glycol polytetrahydrofuran polytetrahydrofuran terminal hydroxyl, polybutenyl succinimide, silica white, silane coupling agent composition and releasing agent.

16. A method of package a high density integrated circuit package structure of claim 9, wherein the micron connecting wires and the chip, and the micron connecting wires and the inner leads are electrical connected by soldering; Pb-free solder is used for soldering; and the Pb-free solder contains 3.2-3.6 wt % of In, 1.3-1.5 wt % of Ag, 0.5-0.6 wt % of Bi, 0.25-0.30 wt % of Cu, 0.10-0.15 wt % of Ge, and the allowance thereof tin (Sn).

* * * * *